United States Patent
Chen

(10) Patent No.: US 7,692,442 B2
(45) Date of Patent: Apr. 6, 2010

(54) APPARATUS FOR DETECTING A CURRENT AND TEMPERATURE FOR AN INTEGRATED CIRCUIT

(75) Inventor: Chung-Hui Chen, HsinChu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/281,142

(22) Filed: Nov. 17, 2005

(65) Prior Publication Data

US 2007/0159208 A1 Jul. 12, 2007

(51) Int. Cl.
*G01R 31/26* (2006.01)

(52) U.S. Cl. .................. 324/769; 324/760; 324/765

(58) Field of Classification Search .......... 324/769; 327/594, 543; 323/312–315
See application file for complete search history.

(56) References Cited

U.S. PATENT DOCUMENTS

| 5,095,227 | A | * | 3/1992 | Jeong ................ 327/512 |
|---|---|---|---|---|
| 5,260,646 | A | * | 11/1993 | Ong .................. 323/349 |
| 5,583,820 | A | * | 12/1996 | Padoan et al. ......... 365/226 |
| 5,610,533 | A | * | 3/1997 | Arimoto et al. ........ 326/33 |
| 5,703,522 | A | * | 12/1997 | Arimoto et al. ........ 327/534 |
| 5,748,548 | A | * | 5/1998 | Padoan et al. ......... 365/226 |
| 5,770,969 | A | | 6/1998 | Walls et al. .......... 327/594 |
| 5,783,934 | A | * | 7/1998 | Tran ................. 323/312 |
| 5,798,669 | A | * | 8/1998 | Klughart ............. 327/539 |
| 5,834,967 | A | * | 11/1998 | Kuroda et al. ......... 327/543 |
| 5,959,464 | A | * | 9/1999 | Qualich .............. 324/769 |
| 6,023,186 | A | * | 2/2000 | Kuroda ............... 327/534 |
| 6,211,689 | B1 | * | 4/2001 | Oki .................. 324/759 |
| 6,727,834 | B2 | * | 4/2004 | Roberts et al. ........ 341/143 |
| 2003/0193771 | A1 | * | 10/2003 | Liao ................. 361/306.2 |
| 2005/0220171 | A1 | * | 10/2005 | Faour et al. .......... 374/178 |
| 2006/0012391 | A1 | * | 1/2006 | Huang ................ 324/769 |
| 2006/0071702 | A1 | * | 4/2006 | Kase ................. 327/530 |
| 2006/0145679 | A1 | * | 7/2006 | Huang ................ 323/315 |

OTHER PUBLICATIONS

Sunita A Chhokra, Rachna Sood, RS Gupta, "Subthreshold current model with modified threshold voltage for submicrometre scale GaAs MESFETS", 1997, Semiconductor Sci Technol vol. 12 pp. 331-337.*
Advanced Linear Devices, Inc. "New design concepts in ultr low voltage and nanopower circuits with EDAD MOSFET arrays" Nov. 4 2005, www.aldinc.com/pdf/newdesignconcepts.pdf.*

* cited by examiner

*Primary Examiner*—Ha Tran T Nguyen
*Assistant Examiner*—Arleen M Vazquez
(74) *Attorney, Agent, or Firm*—K&L Gates LLP

(57) ABSTRACT

The present invention discloses an apparatus for detecting a current flowing from a first node to a second node. One or more MOS devices are serially coupled between the first and second nodes. Each of the MOS devices has its body connected to its source and its gate connected to its drain for providing each MOS device with a voltage difference between its gate and its source that is lower than a threshold voltage of the same, such that a voltage difference measured between the first and second nodes responds to a change of the current exponentially.

11 Claims, 3 Drawing Sheets

APPARATUS FOR DETECTING A CURRENT AND TEMPERATURE FOR AN INTEGRATED CIRCUIT

BACKGROUND

The present invention relates generally to integrated circuit (IC) designs, and more particularly to an apparatus for detecting a current and temperature of an IC.

In recent IC designs, the power supply network often requires some devices to stabilize the voltage near circuits that demand rapid current transitions. One of such devices is a decoupling capacitor coupled with a protected circuit in parallel between a supply voltage and a complementary supply voltage, such as ground. A capacitor controlling circuit is often coupled with the capacitor for coupling and decoupling the same in response to a control signal. During the operation of the capacitor, there may be a leakage current generated therefrom. In order to control the leakage current, it is desirable to have a detection circuit that is capable of detecting the leakage current.

Conventionally, a detection circuit is often implemented to detect the leakage current from the capacitor. Such detection circuit typically includes a metal-oxide-semiconductor (MOS) device coupled between the capacitor and ground. The amount of the leakage current flowing across the MOS device is linearly proportionate to the voltage difference between the gate and source of the same. Thus, the amount of the leakage current can be determined by measuring the voltage difference between the gate and source of the MOS device.

As semiconductor technology advances to nanotechnologies, the supply voltage of the IC can be as low as 1 volt, or even lower. Due to the low operation voltage, the leakage current becomes small, and hard to detect. This is particularly true when a change of the sensing voltage, which is the voltage difference between the gate and source of the MOS device, is proportionate to a change of the leakage current, only linearly. In other words, the sensing voltage is insensitive to a change of the leakage current when its level is low.

Moreover, the conventional detection circuit usually occupies a large area in the IC. When the leakage current to be detected becomes small, the area occupied by the detection circuit certainly needs to be reduced.

Thus, it is desirable to have a detection circuit of a compact configuration that can detect small current with an improved sensing sensitivity.

SUMMARY

The present invention discloses an apparatus for detecting a current flowing from a first node to a second node. One or more MOS devices are serially coupled between the first and second nodes. Each of the MOS devices has its body connected to its source and its gate connected to its drain for providing each MOS device with a voltage difference between its gate and its source that is lower than a threshold voltage of the same, such that a voltage difference measured between the first and second nodes responds to a change of the current exponentially.

The construction and method of operation of the invention, however, together with additional objects and advantages thereof will be best understood from the following description of specific embodiments when read in connection with the accompanying drawings.

DESCRIPTION

Figure 1:
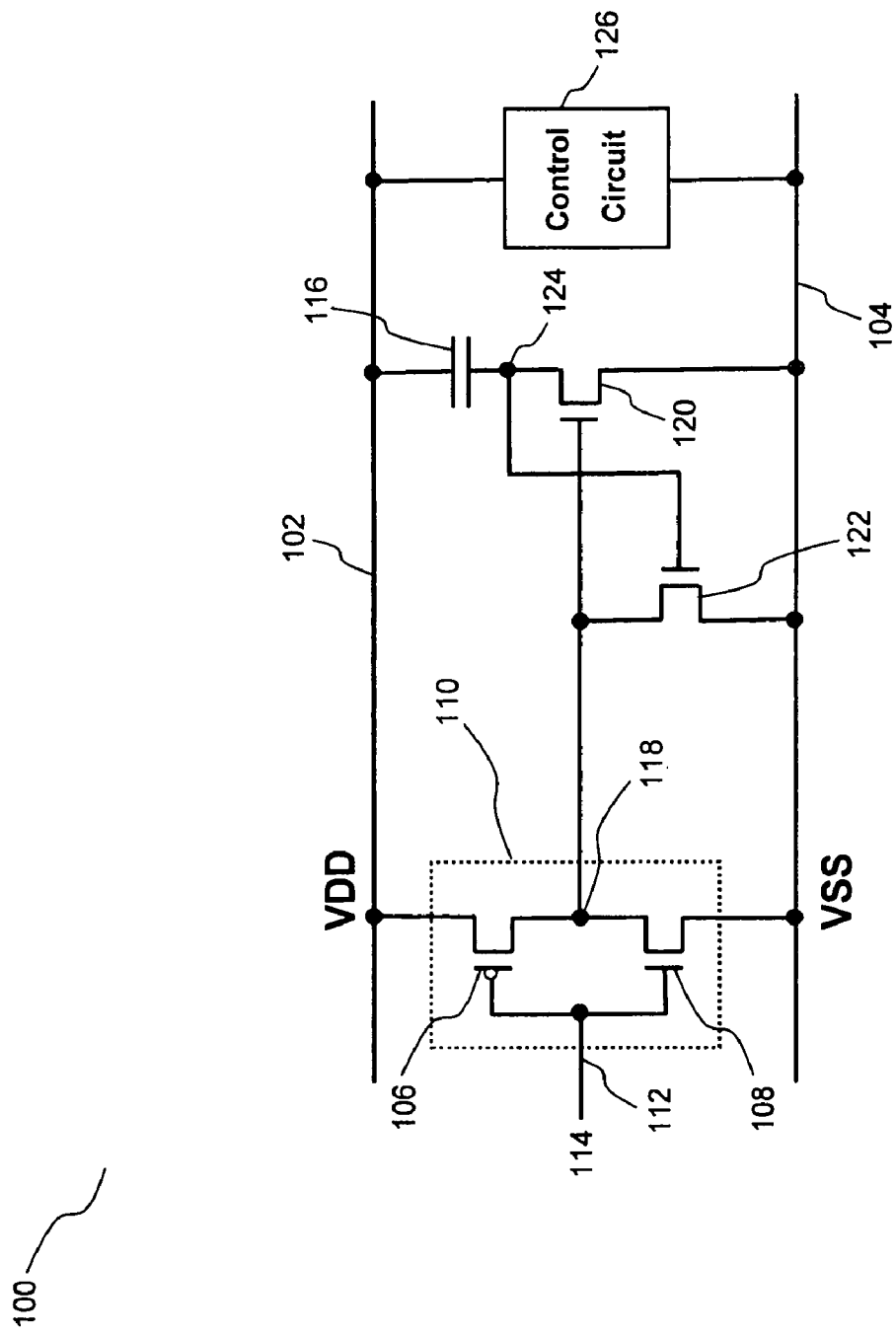
FIG. 1 illustrates a conventional decoupling capacitor control circuit.

FIG. 1 illustrates a conventional decoupling capacitor control circuit 100. As shown, a voltage rail 102 provides a supply voltage, VDD, to the circuit 100 while another voltage rail 104 supplies a complementary supply voltage, such as ground potential, to the same. A PMOS device 106 and an NMOS device 108 together form an inverter 110. A conductive line 112 is used to input a control signal 114 to the inverter circuit 110 which will act to connect or disconnect a decoupling capacitor 116 as needed. The output of the inverter circuit 110 at a node 118 is also an input to the gate of an NMOS device 120 which is connected between the decoupling capacitor 116 and the voltage rail 104. An NMOS device 122 is connected between the node 118 and the voltage rail 104. The gate of the NMOS device 122 is connected to a node 124 between the NMOS device 120 and the decoupling capacitor 116. A control circuit 126 is coupled between the voltage rails 102 and 104. The decoupling capacitor 116 can stabilize the control circuit 126, and increase its reliability, efficiency, and speed.

It is understood that it is possible for leakage of current to occur at the decoupling capacitor 116. For this reason, a conventional current leakage control circuit (not shown in the figure) is implemented to detect and control the leakage current. By controlling the leakage current of the decoupling capacitor 116, power can be saved during the operation of the circuit 100.

When leakage occurs at the decoupling capacitor 116, the voltage difference between the gate and source (Vgs) of the NMOS device 120 is measured for determining the leakage current, which is equal to the drain-to-source current (Ids) of the same. It is understood that Vgs responds to a change of Ids linearly. When the leakage current is small, a change of Vgs induced by a change of the leakage current becomes small, too. In other words, the change of the sensing voltage, i.e., Vgs, is insensitive to the change of the leakage current.

Figure 2A:
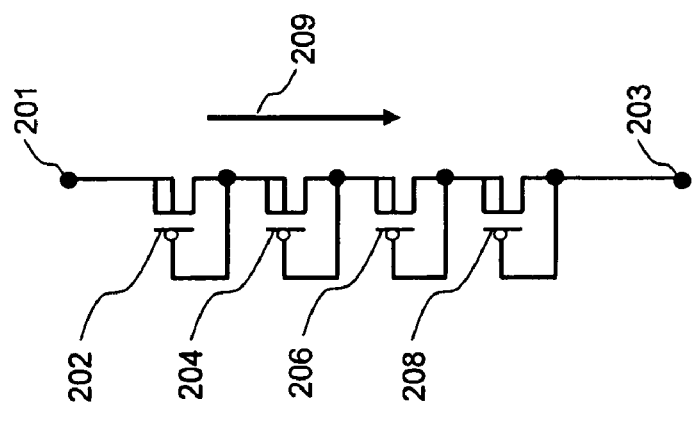
FIG. 2A illustrates a detection circuit for detecting a current and temperature for an IC in accordance with one embodiment of the present invention.

FIG. 2A illustrates a detection circuit 200 for detecting a current in accordance with one embodiment of the present invention. The detection circuit 200 includes a set of cascode PMOS devices 202, 204, 206, and 208. The four PMOS devices 202, 204, 206, and 208 are serially coupled between a first node 201 and a second node 203. The drain of the PMOS device 202 is coupled to the source of the PMOS device 204; the drain of the PMOS device 204 is coupled to the source of the PMOS device 206; and the drain of the PMOS device 206 is coupled to the source of the PMOS device 208. The source of the PMOS device 202 is coupled to the first node 201, and the drain of the PMOS device 208 is coupled to the second node 203. The first and second nodes 201 and 203 can be any two nodes of difference potentials in an IC. For example, the first and second nodes 201 and 203 can represent a supply voltage and a complementary supply voltage, such as ground, respectively.

Each of the PMOS devices 202, 204, 206 and 208 has its gate connected to its drain, and its body connected to its source. With a sufficient number of such cascode PMOS devices coupled between the first and second nodes 201 and 203, each of them can operate in a sub-threshold region, meaning Vgs of each PMOS device is smaller than the threshold voltage (Vt) of the same. When a MOS device operates in the sub-threshold region, it behaves according to the following formula:

$$Ids \cong e^{q(Vgs-Vt)/kT}$$

where Ids is the drain-to-source current, q and k are constants, and T is the temperature of the MOS device. With these cascode PMOS devices, a small change of the Ids, can generate a larger change of Vgs for each PMOS device, since Vgs responds to a change of Ids, exponentially. The voltage difference between the first and second nodes 201 and 203 equals to the summation of the Vgs for the PMOS devices 202, 204, 206 and 208. Thus, only a small Ids is needed to generate a large voltage difference between the two nodes. This increases the sensing margin for the voltage difference between the first and second nodes 201 and 203. The voltage difference measured between the two nodes can be converted into the current by using the above formula. As an alternative, the current can be determined by using a look-up table with the measured voltage difference treated as a known factor.

It is noted that the number of the PMOS devices depends on a predetermined allowable range of the voltage difference between the first and second nodes 201 and 203. For example, in a typical nano-scale circuit where a 1 volt power supply is used and each PMOS device would have a low threshold voltage of around 0.3 volt. The first node 201 is connected to the power supply and the second node 203 is connected to ground. This low threshold voltage also means a much lower sensing voltage for detecting a small current 209. By cascode four PMOS devices 202, 204, 206 and 208 in the way described above, every PMOS device will be biased in the sub-threshold region as long as the voltage across the first and second nodes 201 and 203 is less than 1200 mV (4×0.3 V=1200 mV). Since the supply voltage is only 1 volt in this example, four cascode PMOS devices are sufficient.

The detection circuit 200 can also detect the temperature of an IC area where the first and second nodes are located. According to the above formula, when the detection circuit 200 operates in the sub-threshold region, Ids is very sensitive to the temperature. This also means the detection circuit can be used for detecting the temperature. One way of detecting the temperature is to determine the Vgs and Ids first. Then convert Vgs and Ids into the temperature by using the above formula. Another way of detecting the temperature is by using a look-up table with Vgs and Ids treated as known factors.

It is also noted that the detection circuit using the cascode PMOS devices is very small in size. It is further noted that NMOS devices, which are configured in the same way as the PMOS devices, can also be used to construct the detection circuit. For example, the detection circuit can include one or more NMOS devices serially coupled between the two nodes, wherein each of the NMOS devices has its body connected to its source and its gate connected to its drain for providing each NMOS device with a voltage difference between its gate and its source that is lower than a threshold voltage of the same.

Figure 2B:
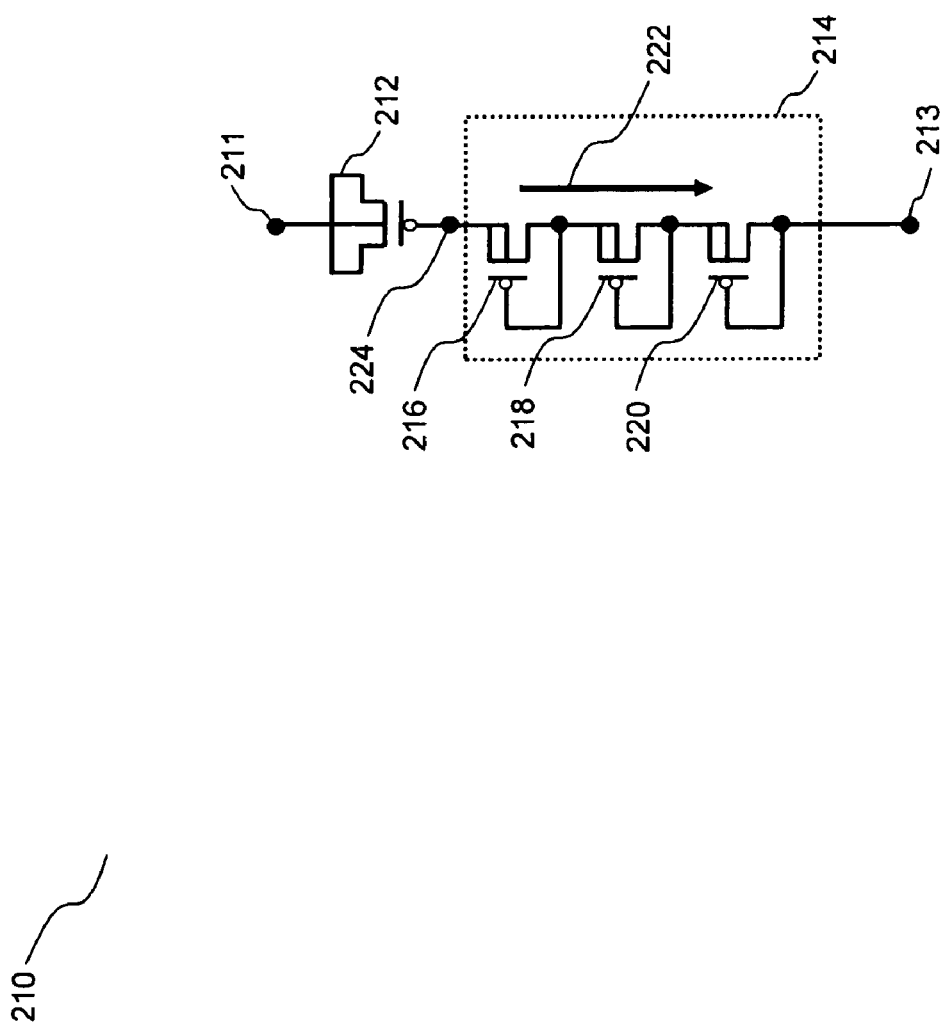
FIG. 2B illustrates a detection circuit for detecting a leakage current from a decoupling capacitor in an IC in accordance with another embodiment of the present invention.

FIG. 2B illustrates a detection circuit 210 for detecting a leakage current from a decoupling capacitor 212 in accordance with another embodiment of the present invention. A decoupling capacitor 212 is implemented with a current and temperature detection circuit 214 similar to the one shown in FIG. 2A. The decoupling capacitor 212 is coupled between a first node 211, which may be connected to a supply voltage, and a second node 224. The current and temperature detector 214 includes three PMOS devices 216, 218, and 220 in a cascode configuration. The three PMOS devices 216, 218, and 220 are serially coupled where the drain of the PMOS device 216 is coupled to the source of the PMOS device 218 while the drain of the PMOS device 218 is coupled to the source of the PMOS device 220. The source of the PMOS device 216 is coupled to the second node 224, and the drain of the PMOS device 220 is coupled to a third node 213, which may be connected to ground. Each of the PMOS devices 216, 218, and 220 has its gate connected to its drain, and its body connected to its source.

The cascode PMOS devices 216, 218, and 220 of the detection circuit 214, like the detection circuit 200 shown in FIG. 2, are designed to operate at a low current within the sub-threshold region. This allows the voltage difference between the second and third node 224 and 213 to respond to a change of a leakage current from the decoupling capacitor 212, exponentially. By cascode PMOS devices in a cascode configuration, each PMOS device can be biased in the sub-threshold region. This means that a higher sensing voltage margin is obtained for a much smaller leakage current. With this circuit 210, the temperature detection is also possible by the above described schemes.

It is noted that NMOS devices, which are configured in the same way as the PMOS devices, can also be used to construct the detection circuit. For example, the detection circuit can include one or more NMOS devices serially coupled between the two nodes, wherein each of the NMOS devices has its body connected to its source and its gate connected to its drain for providing each NMOS device with a voltage difference between its gate and its source that is lower than a threshold voltage of the same.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. An apparatus for detecting a temperature and a current flowing from a first node to a second node of an integrated circuit area, the apparatus comprising:

a set of MOS devices directly coupled in series between the first and the second nodes with a drain of each MOS device coupled to its own gate and to a source of its adjacent MOS device, and operating in a sub-threshold region of The integrated circuit area; and means for determining temperature of the sub-threshold region of the integrated circuit area by measuring a voltage difference between the first and the second nodes, wherein the voltage difference is determined by a formula of $Ids \cong e^{q(Vgs-Vt)/kT}$, where Ids represents drain-to-source current, q and k constants, T temperature of the set of MOS devices, Vt the threshold voltage of the set of MOS devices, and Vgs a gate-to-source voltage, and wherein the Vgs of each MOS device is smaller than the Vt of the same, such that each MOS device operates in the sub-threshold region.

2. The apparatus as claimed in claim 1, wherein the set of MOS devices are PMOS devices.

3. The apparatus as claimed in claim 1, wherein the set of MOS devices are NMOS devices.

4. The apparatus as claimed in claim 1, further comprising:

means for converting the voltage difference between the first node and the second node into current by applying the formula of $Ids \cong e^{q(Vgs-Vt)/kT}$.

5. The apparatus as claimed in claim 4, wherein the converting means is a look-up-table.

6. The apparatus as claimed in claim 1 further comprising:

a decoupling capacitor coupled between a supply voltage and the first node.

7. An apparatus for detecting a temperature and a leakage current flowing from a first node to a second node of an integrated circuit area, the apparatus comprising:

a capacitor coupled between a supply voltage and the first node;

a set of MOS devices directly coupled in series between the first and the second nodes with a drain of each MOS device coupled to its own gate and to a source of its adjacent MOS device, and operating in a sub-threshold region of the integrated circuit area;

means for determining temperature of the sub-threshold region of the integrated circuit area by measuring a voltage difference between the first and the second nodes, and wherein the voltage difference is equivalent to a formula of $Ids \cong e^{q(Vgs-Vt)/kT}$, where Ids represents drain-to-source current, q and k constants, T temperature of the MOS devices, Vt the threshold voltage of the MOS devices, and Vgs a gate-to-source voltage, and wherein the Vgs of each MOS device is smaller than the Vt of the same, such that each MOS device operates in the sub-threshold region.

8. The apparatus as claimed in claim 7, wherein the set of MOS devices are PMOS devices.

9. The apparatus as claimed in claim 7, wherein the set of MOS devices are NMOS devices.

10. The apparatus as claimed in claim 7, further comprising:

means for converting the voltage difference between the first node and the second node into current by applying the formula of $Ids \cong e^{q(Vgs-Vt)/kT}$.

11. The apparatus as claimed in claim 10, wherein the converting means is a look-up-table.

* * * * *